United States Patent

[11] 3,609,594

[72] Inventors Murray H. Mott;
Donald B. Kavanagh, both of San Diego, Calif.

[21] Appl. No. 879,471
[22] Filed Nov. 24, 1969
[45] Patented Sept. 28, 1971
[73] Assignee The United States of America as represented by the Secretary of the Navy

[54] SOLID-STATE BACKWARD WAVE OSCILLATOR MODULATOR
2 Claims, 3 Drawing Figs.

[52] U.S. Cl. .......... 332/7, 307/246, 328/232, 331/6, 331/82, 332/25, 332/30 R
[51] Int. Cl. .......... H03c 1/28
[50] Field of Search .......... 332/7, 13, 25, 58, 30; 331/6, 82; 307/246; 328/232

[56] References Cited

UNITED STATES PATENTS

| | | | |
|---|---|---|---|
| 2,751,518 | 6/1956 | Pierce | 331/82 X |
| 3,114,886 | 12/1963 | De Santis et al. | 332/7 X |
| 3,225,314 | 12/1965 | Rambo | 332/58 X |
| 3,249,889 | 5/1966 | Brocato | 331/82 |
| 3,491,312 | 1/1970 | Wilson | 332/25 X |

*Primary Examiner*—Alfred L. Brody
*Attorneys*—R. S. Sciascia, George J. Rubens and John W. McLaren

ABSTRACT: A solid-state modulator for driving a backward wave oscillator (BWO) to produce an output frequency that varies linearly with time. The modulator generates a voltage having an exponential waveform which is complementary to, i.e., matches, the turning curve of the BWO. By driving the helix of the BWO with the voltage produced by the modulator, the frequency of oscillation of the BWO can be swept through a wide frequency range in a linear manner. The modulator includes a solid-state state isolator stage and a solid-state switching stage. The circuit produces the exponential waveform by charging a capacitance during the on-time of the solid-state stages and by discharging the capacitance through an RC circuit during the off-time of the solid-state stages.

PATENTED SEP 28 1971 3,609,594

INVENTOR.
MURRAY H. MOTT
BY DONALD B. KAVANAGH

George J. Rubens
ATTORNEYS

SOLID-STATE BACKWARD WAVE OSCILLATOR MODULATOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

A backward wave oscillator is an oscillator which uses a special vacuum tube in which electrons are bunched by an RF magnetic field as they flow from cathode to anode. This bunching action is such as to produce a backward wave that becomes larger as it progresses toward the electron gun end of the tube. The magnetic field is produced by a folded line structure such as a helix disposed coaxially relative to the axis of the electron beam. The output signal is taken from the gun end of this folded line. Backward wave oscillators are also classified as voltage tuned wave generators having a broad tuning range within the microwave frequency spectrum. In several BWO applications it is required that the frequency range of the tube be swept linearly with time so that the rate of change of frequency with respect to time is a constant. Such a linear sweep however is difficult to accomplish since the frequency versus voltage characteristic tuning curve of a BWO itself is exponential, not linear.

In a BWO, electrons are projected in an extended stream in the vicinity of a wave propagating structure in a manner such that oscillatory energy is produced by the attraction or transfer of energy from the electron stream to a backward wave which propagates along the wave-propagating structure at a velocity substantially equal to that of the electron stream. The frequency of oscillations produced by such interaction or feedback can be controlled by regulating the velocity of the electron stream above or below a certain value substantially equal to the velocity of the backward wave. Thus, the tube of the BWO can be swept through a wide frequency range by applying a modulating voltage to an electrode which controls the space current of the tube and thus controls the velocity of the electron stream. The swept frequency can be made linear with time by driving the BWO with a modulating voltage having an exponential waveform.

Vacuum tubes have been used in modulator circuits to drive BWO's to produce an output frequency which is linear with respect to time. In such circuits, however, the BWO requires a special low capacitance filament transformer with obvious high cost. Electron multiplier tubes can be used in BWO modulator circuits; however, their relatively high cost and low duty cycle are major disadvantages. Consequently, it has become desirable to devise a low cost solid state modulator for a BWO which will give a substantially linear frequency sweep with respect to time.

SUMMARY OF THE INVENTION

A solid-state modulator for frequency modulating a backward oscillator tube is disclosed. The modulator basically comprises a transistorized isolation circuit and a transistorized switching circuit which generates a drive signal having a voltage versus time characteristic which is complementary to the characteristic exponential tuning curve of the BWO. The transistorized circuits charge the total circuit capacitance at the BWO helix during the on-time of the transistors. When the transistors are switched off, the positive output voltage of the helix discharges through a load resistance and capacitance and the constant current load of the BWO with a time constant determined by the capacitance and the resistance. As the voltage across the capacitance decreases, the frequency of oscillation of the BWO is decreased since the operating frequency of the oscillator is determined by the voltage applied to the helix and varies substantially as an exponential function of the voltage applied thereto. The decrease in frequency with time may be made substantially linear by selectively choosing certain operating parameters of the modulating circuit.

STATEMENT OF THE OBJECTS OF THE INVENTION

An object of the present invention is to provide a solid-state modulator for driving a backward wave oscillator to produce an output frequency that varies linearly with time.

Another object of the present invention is to provide an inexpensive, transistorized modulator for frequency-modulating a BWO by driving it with a voltage having a waveform which matches the tuning curve of the BWO.

Other objects of this invention will become apparent through the following detailed description of the invention when considered in conjunction with the accompanying drawings.

DESCRIPTION OF THE PREFERRED EMBODIMENT

Figure 1:
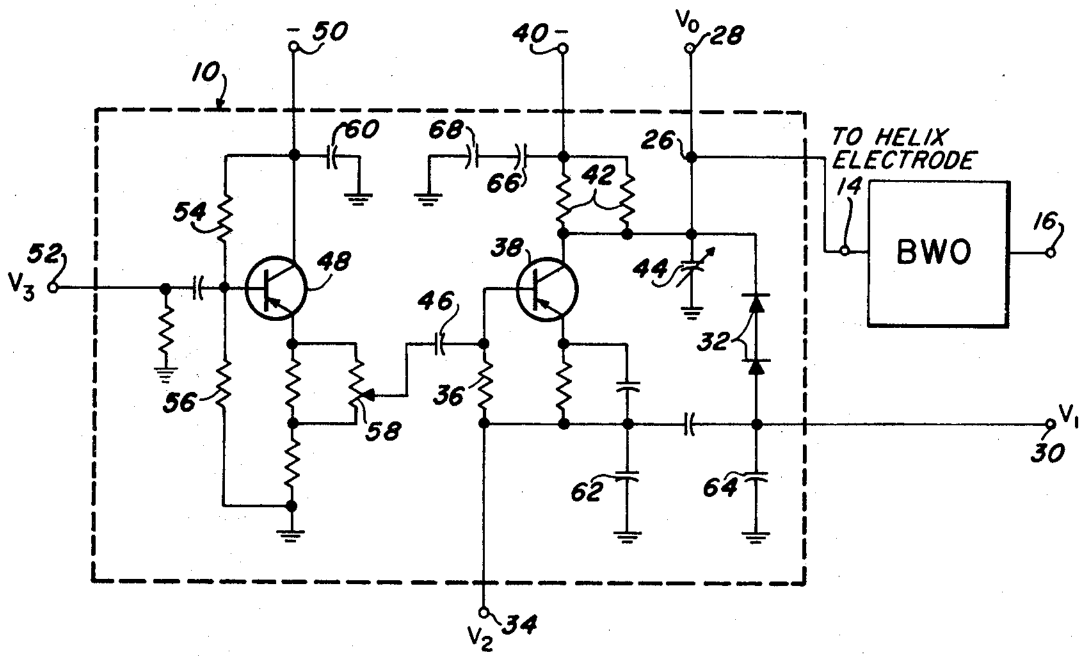
FIG. 1 is a schematic diagram of the BWO modulator of the present invention.

FIG. 1 is a schematic diagram of a BWO modulator 10 illustrating the inventive concept embodied in the present invention. Since the structure and operation of BWO's are well known to those skilled in the art, the BWO 12 which is to be driven by the voltage produced by the modulator 10 is shown in simplified form. The output terminal 28 of the modulator 10 is shown connected at the terminal point 26 to the helix input terminal 14 of the conventional BWO 12 which produces a swept frequency at the output terminal 16 thereof. The terminal 14 couples the modulating voltage from the modulator 10 to the helix electrode. A first DC voltage $V_1$ is also connected to terminal point 26 through the serially connected clamp diodes 32. The two clamp diodes are connected in a forward bias manner with respect to the voltage $V_1$ which is applied to the input terminal 30. A second source of DC voltage $V_2$ is applied to the modulator circuit at the input terminal 34. Voltage $V_2$ has a magnitude greater than voltage $V_1$.

Terminal 34 is connected through resistor 36 to the base of a first transistor 38. A second terminal 40, which is adapted to receive a negative bias voltage, is connected through the parallel combination of the load resistors 42 to the collector of the transistor 38. A variable capacitor 44 is connected in parallel with the resistors 42 to the terminal point 26.

The base of the transistor 38 is connected to the emitter of a second transistor 48 through the coupling capacitor 46. An input terminal 50, which is adapted to receive a negative bias voltage, is connected to the collector of transistor 48; a second input terminal 52, which is adapted to receive a drive voltage, $V_3$, is connected to the base of the transistor 48.

OPERATION

Figure 3:
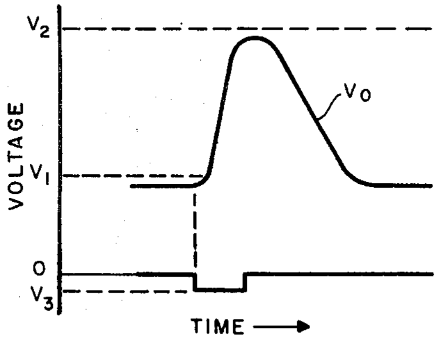
FIG. 3 is a graphical representation of a helix drive voltage generated by the modulator circuit of the present invention and of the drive pulse which actuates the modulator circuit.

In the absence of a drive signal $V_3$ at the modulator 10 input terminal 52, the diodes 32 are forward biased. In this condition the diodes clamp the BWO helix at a potential $V_0$ equal to the voltage $V_1$ minus the voltage drop across the diodes as shown in FIG. 3. Upon the application of the negative drive pulse $V_3$ to the modulator 10 at the base of the transistor 48, the pulse is coupled to the base of the transistor 38. Transistor 38 is then switched on in a well-known manner in response to the coupled pulse.

When the transistor 38 is in the "on" state, the voltage $V_0$ at the BWO helix input terminal 14 is equal to $V_2$ minus the voltage drop across the transistor switch 38 as shown in FIG. 3. With the circuit in this condition, the clamp diodes 32 block the voltage $V_1$ from the helix input terminal 14 since the diodes are back-biased. After the input drive pulse $V_3$ returns to a value of zero, as shown in FIG. 3, the transistor 38 is switched off.

With the transistor 38 in the "off" condition, the voltage $V_o$ appearing at the BWO helix begins discharging in an exponential fashion from a value slightly less than $V_2$ to a value slightly less than $V_1$. The voltage on the helix discharges with a time constant determined by the load resistors 42, load capacitor 44, the BWO helix capacitance and any stray circuit capacitance. Upon reaching a value approximately equal to $V_1$, the helix voltage is "clamped" at that value by the clamping action of diodes 32. It should be noted that as the voltage across the capacitor 44 decreases, the frequency of oscillation of the BWO 12 is decreased by virtue of the connection from the helix input terminal 14 to the capacitor 44.

The variable capacitor 44 can be selectively adjusted to obtain a helix voltage curve $V_o$ which matches the characteristic curve of the BWO. The asymptotic voltage discharge limit required to match the tuning curve of the BWO for a linear swept output RF signal is determined by selectively adjusting the value of the bias supply voltage applied at terminal 40. That is, the capacitor 44 is selectively adjusted to obtain the optimum match between the BWO helix voltage waveform and the BWO tuning curve thereby generating a linear FM output RF signal.

Figure 2:
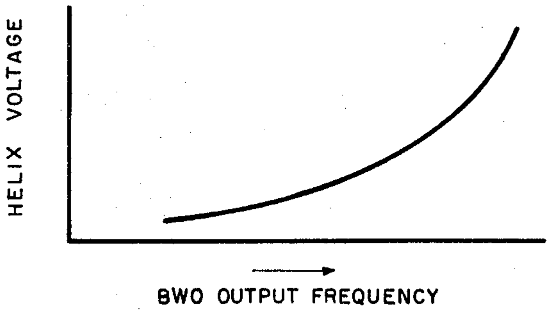
FIG. 2 is a graphical representation of a typical BWO tuning curve showing the relationship between helix voltage and BWO output frequency.

Hence, since the tuning curve of a typical BWO is approximately exponential as shown in FIG. 2, by driving the BWO helix with a voltage $V_o$ having an exponential waveform, it is possible to obtain an output frequency that varies linearly with time. From FIG. 3 it can be seen that the voltage at the helix in the absence of a negative drive pulse $V_3$ at terminal 52 is clamped at approximately voltage $V_1$. Upon the application of a drive pulse $V_3$, the voltage at the helix increases to a value of approximately $V_2$. When the amplitude of drive signal $V_3$ returns to zero the helix voltage decreases in an exponential fashion to approximately the voltage $V_1$.

For optimum operation of the modulator circuit, the clamp diodes 32 should have a fast recovery time and low shunt capacitance. Diodes meeting these characteristics usually have breakdown voltages less than those required; accordingly, it is often necessary to connect two diodes in series as shown in FIG. 1. The combination of the resistors 54 and 56 provides a base biasing network for the transistor 48. The potentiometer 58 is selectively adjusted to obtain the optimum drive signal for the transistor 38 to more effectively achieve the desired helix voltage discharge curve. The capacitors 60, 62, 64, and the series combination of 66 and 68 function as power supply bypass capacitors for the bias voltage applied to the terminal 50, the voltage $V_2$, the voltage, $V_1$, and the bias voltage applied to terminal 40, respectively.

It can be appreciated that a unique solid-state modulator circuit for driving a backward wave oscillator to produce an output frequency that varies linearly with time has been disclosed. The helix of the BWO is driven by the voltage produced by the modulator such that the frequency of oscillation of the BWO can be swept through a wide frequency range in a linear manner. Obviously many modifications and variations of the present invention are possible in the light of the above teachings. It is therefore to be understood that within the scope of the appended claims the invention may be practiced otherwise than as specifically described.

What is claimed is:

1. A solid-state modulator circuit for driving a backward wave oscillator with a selectively predetermined modulating voltage comprising:

first modulator input terminal means connected to a first DC voltage;

modulator output terminal means adapted to be connected to the helix of a backward wave oscillator;

diode means connected between said first input terminal means and said output terminal means in a forward-bias manner with respect to said first DC voltage to thereby clamp said helix to said first DC voltage;

second modulator input terminal means connected to a second DC voltage, said second DC voltage having a magnitude greater than said first DC voltage;

third modulator input terminal means connected to a modulator drive voltage;

controlled solid-state switch means connected to said second and third modulator input terminal means, said switch means being in a normally nonconductive state and being responsive to the application of said drive voltage to said third input terminal means to switch to a conductive state whereby said second DC voltage is coupled to said helix and said diode means are simultaneously reverse-biased to thereby block said first DC voltage from said helix; and, variable capacitor means and load resistor means connected to said modulator output terminal means whereby said modulating voltage applied to said helix is discharged in a substantially exponential manner from a value substantially equal to said second DC voltage to a value substantially equal to said first DC voltage in response to the removal of said modulator drive voltage from said third input terminal means.

2. The modulator circuit of claim 1 wherein said solid-state switch means comprises a first and a second PNP transistor, said first transistor having its base connected to said third input terminal means and further having its emitter connected through a coupling capacitor to the base of said second transistor, said second transistor further having its base connected to said second input terminal means, and having its collector connected to said output terminal means.